US008792835B2

(12) United States Patent
Andreu et al.

(10) Patent No.: US 8,792,835 B2
(45) Date of Patent: Jul. 29, 2014

(54) SYSTEM AND METHOD FOR WIRELESSLY TESTING INTEGRATED CIRCUITS

(75) Inventors: David Andreu, Montarnaud (FR); Philippe Cauvet, Caen (FR); Marie-Lise Flottes, St Georges d'orques (FR); Ziad Noun, Baalbeck (LB); Serge Bernard, St Georges d'orques (FR)

(73) Assignee: Centre National de la Recherche Scientifique, Paris Cedex (FR)

( * ) Notice: Subject to any disclaimer, the term of this patent is extended or adjusted under 35 U.S.C. 154(b) by 705 days.

(21) Appl. No.: 13/119,797

(22) PCT Filed: Sep. 22, 2009

(86) PCT No.: PCT/EP2009/062285
§ 371 (c)(1),
(2), (4) Date: Jun. 17, 2011

(87) PCT Pub. No.: WO2010/031879
PCT Pub. Date: Mar. 25, 2010

(65) Prior Publication Data
US 2011/0244814 A1 Oct. 6, 2011

(30) Foreign Application Priority Data

Sep. 22, 2008 (EP) .................................. 08290891

(51) Int. Cl.
H04B 17/00 (2006.01)
(52) U.S. Cl.
USPC .................................. 455/67.14; 455/67.11
(58) Field of Classification Search
CPC .................................................... G01R 31/303
USPC .................................. 455/67.11, 67.14, 63.1
See application file for complete search history.

(56) References Cited

U.S. PATENT DOCUMENTS

| 7,383,478 | B1 | 6/2008 | Ballagh et al. |
| 2003/0174171 | A1* | 9/2003 | Desplats et al. ............. 345/771 |
| 2005/0086021 | A1* | 4/2005 | Khandros et al. ............ 702/121 |
| 2005/0096805 | A1* | 5/2005 | Fudali et al. .................... 701/29 |
| 2005/0193294 | A1* | 9/2005 | Hildebrant .................... 714/723 |
| 2006/0052075 | A1* | 3/2006 | Galivanche et al. ......... 455/323 |

(Continued)

OTHER PUBLICATIONS

Te-Wen Ko, et al.; *Stable Performance MAC Protocol for HOY Wireless Tester under Large Population*; article; 2007; pp. 1-4; Hsinchu, Taiwan.

(Continued)

*Primary Examiner* — Lewis West
(74) *Attorney, Agent, or Firm* — Miller, Matthias & Hull LLP

(57) ABSTRACT

A system and method for wirelessly testing integrated circuits provides a multiple layer interface to wirelessly test integrated circuits. A wireless testing structure for an integrated circuit comprises a wireless transceiver and a wireless test interface. The wireless transceiver is configured to receive test information from a tester and transmit test result information to the tester. The wireless test interface is configured to interface between the wireless transceiver and the integrated circuit. The wireless test interface comprises a media access controller and a test control block. The media access controller is configured to implement a media access control protocol for wireless communication. The test control block is configured to decode test information received from the tester, to trigger a test of the integrated circuit in response to the decoded test information, and to encode test result information that is generated by the integrated circuit in response to the test.

24 Claims, 12 Drawing Sheets

(56) References Cited

U.S. PATENT DOCUMENTS

| | | | |
|---|---|---|---|
| 2006/0066326 A1* | 3/2006 | Slupsky | 324/753 |
| 2006/0252375 A1* | 11/2006 | Wu et al. | 455/67.11 |
| 2007/0026809 A1* | 2/2007 | Zhang et al. | 455/67.11 |
| 2007/0157056 A1* | 7/2007 | Haehn et al. | 714/724 |
| 2007/0198445 A1* | 8/2007 | Zen | 706/15 |
| 2007/0232240 A1* | 10/2007 | Wu et al. | 455/73 |
| 2008/0209293 A1* | 8/2008 | Wu et al. | 714/733 |
| 2009/0066356 A1* | 3/2009 | Slupsky et al. | 324/765 |
| 2010/0049465 A1* | 2/2010 | Pineda De Gyvez et al. | 702/122 |
| 2013/0207681 A1* | 8/2013 | Slupsky et al. | 324/754.21 |

OTHER PUBLICATIONS

Cheng-Wen Wu, et al.; *The HOY Tester—Can IC Testing Go Wireless?*; article; 2006; pp. 1-4; Hsinchu, Taiwan.

International Search Report from related PCT Application No. PCT/EP2009/062285; report dated Dec. 18, 2009.

* cited by examiner

SYSTEM AND METHOD FOR WIRELESSLY TESTING INTEGRATED CIRCUITS

CROSS-REFERENCE TO RELATED APPLICATIONS

This application is a U.S. national stage filing of International Patent Application No. PCT/EP2009/062285 filed on Sep. 22, 2009, which claims priority under the Paris Convention to French Patent Application No. 08 290891.4, filed on Sep. 22, 2008.

FIELD OF THE DISCLOSURE

Embodiments of the invention relate generally to integrated circuits and, more particularly, to a system and method for wirelessly testing integrated circuits.

BACKGROUND OF THE DISCLOSURE

Wireless testing of integrated circuits, which involves integrating a wireless transceiver in each integrated circuit and allowing the wireless exchange of test information between the integrated circuit and a tester equipped with a wireless transceiver, can ensure the quality of the integrated circuits by analyzing and correcting any encountered defects.

A concern with wireless testing of integrated circuits is that the sharing of a transmission medium may result in collisions between the communications of the integrated circuits and the tester. In addition, fragmenting and packaging of test signals need to be performed in the tester to produce packets for transmission. Furthermore, the test signals need to be extracted from received packets and applied to the integrated circuits and the responses of the integrated circuits need to be provided to the tester.

SUMMARY OF THE DISCLOSURE

A system and method for wirelessly testing integrated circuits provides a multiple layer interface to wirelessly test integrated circuits.

In an embodiment, a wireless testing structure for an integrated circuit comprises a wireless transceiver and a wireless test interface. The wireless transceiver is configured to receive test information from a tester and transmit test result information to the tester. The wireless test interface is configured to interface between the wireless transceiver and the integrated circuit. The wireless test interface comprises a media access controller and a test control block. The media access controller is configured to implement a media access control protocol for wireless communication. The test control block is configured to decode test information received from the tester, to trigger a test of the integrated circuit in response to the decoded test information, and to encode test result information that is generated by the integrated circuit in response to the test.

In an embodiment, a method for wirelessly testing an integrated circuit comprises wirelessly receiving test information using a media access control protocol, decoding the test information and triggering a test of the integrated circuit in response to the decoded test information, encoding test result information that is generated by the integrated circuit in response to the test, and wirelessly transmitting the encoded test result information using the media access control protocol.

In an embodiment, a method for wirelessly implementing tests on a plurality of integrated circuits comprises wirelessly transmitting test information to the plurality of integrated circuits using a media access control protocol, wirelessly receiving the test information using the media access control protocol, decoding the test information received from the tester and triggering a test of a respective integrated circuit in response to the decoded test information, encoding test result information that is generated by the respective integrated circuit in response to the test, and wirelessly transmitting the encoded test result information using the media access control protocol.

Other aspects and advantages of embodiments of the present invention will become apparent from the following detailed description, taken in conjunction with the accompanying drawings, illustrated by way of example of the principles of the invention.

BRIEF DESCRIPTION OF THE DISCLOSURE

Throughout the description, similar reference numbers may be used to identify similar elements.

DETAILED DESCRIPTION OF THE DRAWINGS

Figure 1:
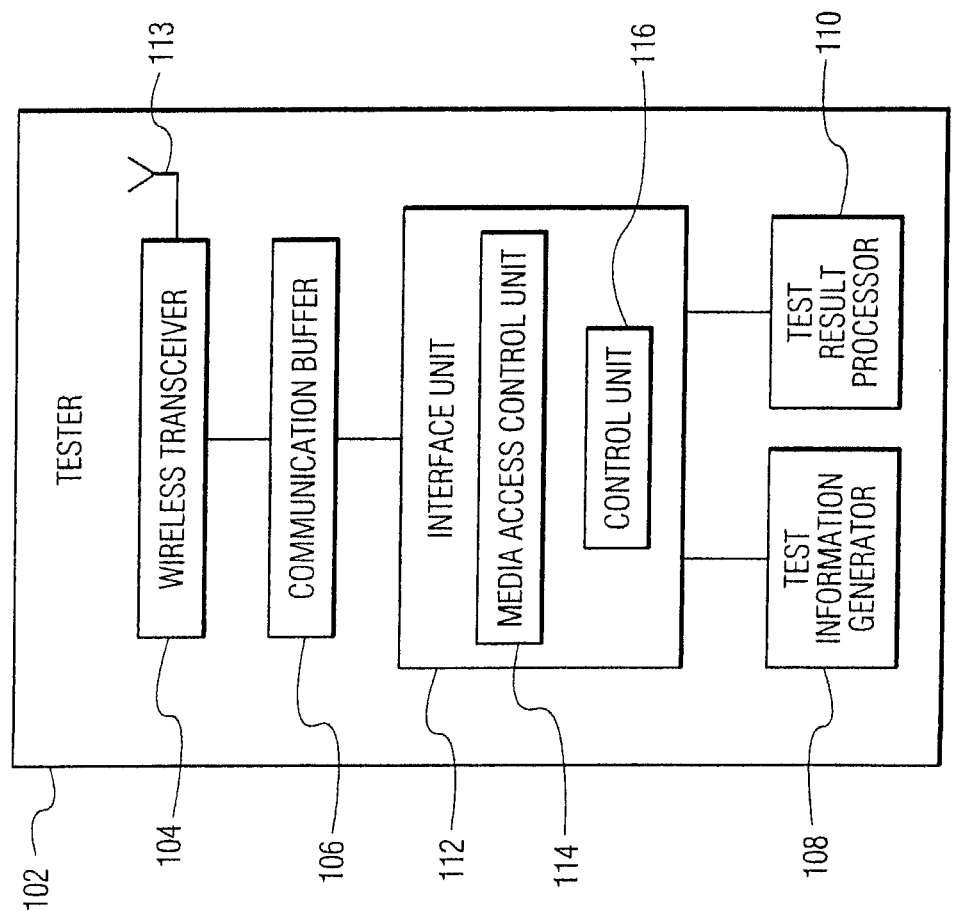
FIG. 1 is a schematic block diagram of a tester in accordance with an embodiment of the invention.

FIG. 1 is a schematic block diagram of a tester in accordance with an embodiment of the invention. The tester may be used in production testing or in-situ testing to wirelessly communicate with integrated circuits and to provide test functions, such as generating test information and processing test result information. Although the depicted system includes several components described herein, other embodiments may include fewer or more components.

As shown in FIG. 1, the tester 102 includes a wireless transceiver 104 to wirelessly communicate with integrated circuits, a communication buffer 106 to buffer incoming and outgoing communications, a test information generator 108 to generate test information, a test result processor 110 to process test result information, and an interface unit 112 to provide an interface between the wireless transceiver, the test information generator, and the test result processor. The wireless transceiver of the tester includes at least one antenna 113 and may be compatible with Institute of Electrical and Electronics Engineers, Inc. (IEEE) 802.15.4, IEEE 802.11, IEEE 802.16, or other wireless communications protocols. The communication buffer may be separated into two buffers, for example, a transmission buffer and a reception buffer. The communication buffer may be implemented in hardware, for example, random access memory (RAM), or software, or a combination of hardware and software. The interface unit includes a media access control unit 114 to implement a media access control protocol for wireless communication and a control unit 116 to encode test signals and to decode test result information received from the integrated circuits. The media access control protocol implemented by the media access controller may be part of a protocol stack unit (not shown) and may support broadcast, multicast, and unicast modes and a unique logical address for each integrated circuit. A more detailed explanation of the media access control protocol is provided below with reference to FIG. 2.

Figure 2:
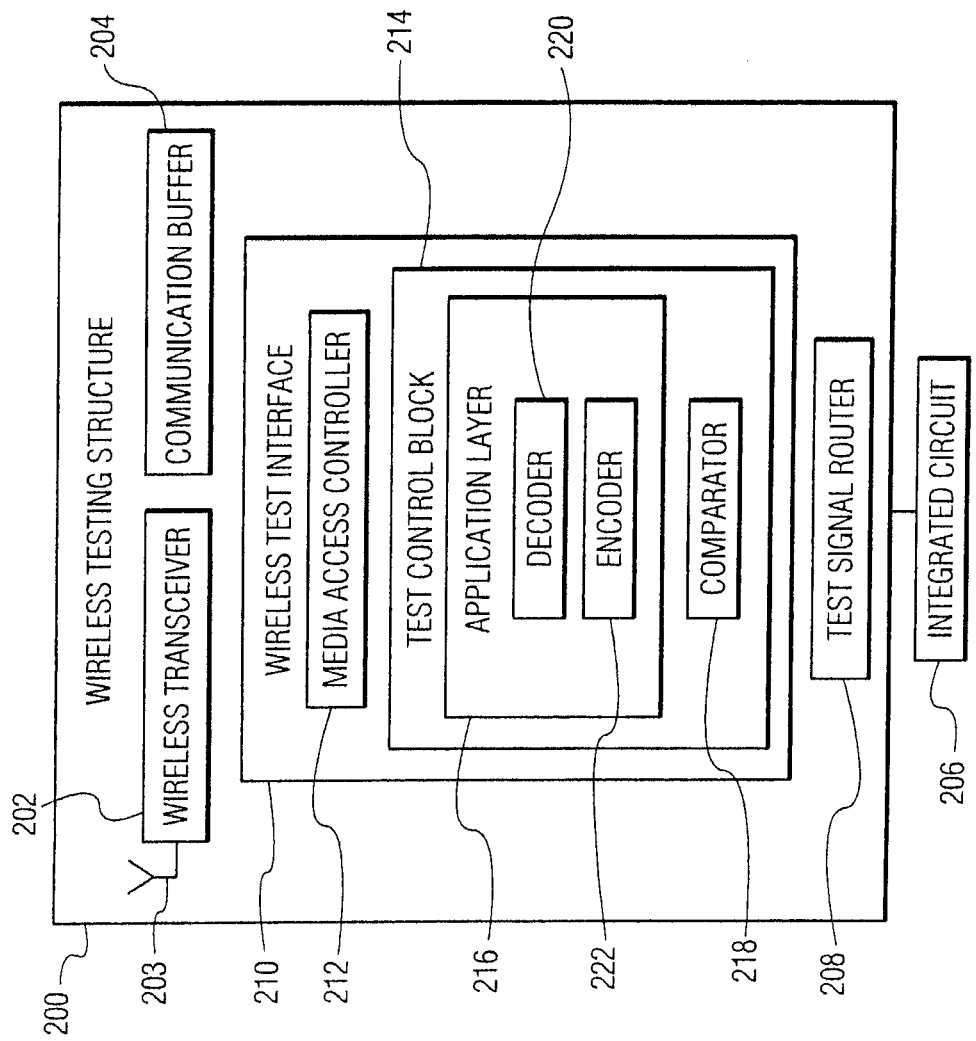
FIG. 2 is a schematic block diagram of a wireless testing structure for an integrated circuit in accordance with an embodiment of the invention.

FIG. 2 is a schematic block diagram of a wireless testing structure 200 for an integrated circuit 206 in accordance with an embodiment of the invention. The wireless testing structure includes a wireless transceiver 202 to wirelessly communicate with the tester 102, a communication buffer 204, a test signal router 208, and a wireless test interface 210. The wireless testing structure can be used to test integrated circuits such as digital blocks, analog blocks, mixed blocks, memories, or microelectromechanical systems (MEMS). In some embodiments, the integrated circuit 206 is a circuit under test (CUT), which may include at least one Intellectual Property (IP) block or at least one integrated circuit die such as a packaged die or a bare die. In other embodiments, the integrated circuit is a device under test (DUT), which may include multiple CUTs and may be a System on Chip (SoC), a System in Package (SiP), or a Printed circuit board (PCB). The wireless testing structure can be used for integrated circuit production testing and for integrated circuits in-situ testing. Although the depicted system includes several functional blocks described herein, other embodiments may include fewer or more functional blocks to implement more or less functionality.

The wireless transceiver 202 of the wireless testing structure 200 includes at least one antenna 203 and may be compatible with a wireless communication protocol such as IEEE 802.15.4, IEEE 802.11, IEEE 802.16, or other wireless communication protocols. The communication buffer 204 may be separated into two buffers, for example, a transmission buffer and a reception buffer. The communication buffer may be implemented in hardware, such as RAM, or software, or a combination of hardware and software. The test signal router 208 interfaces between the wireless test interface 210 and the integrated circuit 206 and may be, for example, a SiP Test Access Port (TAP). The test signal router 208 routes the test signals, including, for example, a test clock signal, a test control signal, and a test data signal to the corresponding circuit block of the integrated circuit 206 and routes the test response from the corresponding circuit block to the wireless test interface. In some embodiments, there may be no test signal router between the wireless test interface and the integrated circuit such that the wireless test interface directly interfaces with the circuit.

The wireless test interface 210 of FIG. 2 provides a multiple layer interface to coordinate communications between the wireless testing structure 200 and the tester 102, to decode test information received from the tester, to trigger a test of the integrated circuit in response to the decoded test information, and to encode test result information that is generated by the integrated circuit in response to the test. The multiple layer interface can be configured to support a number of different testing scenarios, such as simultaneously testing of a number of integrated circuits after fabrication and while the integrated circuits are still in wafer form or, testing integrated circuits after the integrated circuits have been packaged and put into use for their intended purpose. In the embodiment of FIG. 2, the wireless test interface includes a media access controller 212 that implements a media access control protocol for wireless communication and a test control block 214 that decodes test information received from the tester, triggers tests of the integrated circuit in response to the decoded test information, and encodes test result information that is generated by the integrated circuit in response to the test.

In an embodiment, the media access control protocol implemented by the media access controller 212 supports broadcast, multicast, and unicast modes and a unique logical address for each integrated circuit 206. Each integrated circuit may be assigned a unique identifier that is set by, for example, electric fuses during the fabrication process. In an embodiment, the unique identifier of an integrated circuit may be used to generate a unique logical address that is different from the logical addresses of the other integrated circuits. In some embodiments, the logical address of an integrated circuit is equal to its unique identifier. In some embodiments, the logical address of an integrated circuit is generated from its unique identifier through a logic combination. In some embodiments, the tester 102 may assign a logical address to an integrated circuit.

In an embodiment, the media access control protocol can be used in the broadcast mode to reduce the test time by allowing the tester 102 to simultaneously send the same set of test information to multiple integrated circuits, for example, multiple integrated circuits on the same wafer. In another embodiment, the media access control protocol is used in the multicast mode to establish groups that allow the tester to, for example, exclude faulty integrated circuits by assigning them to one or more groups according to their fault type, or to test a heterogeneous wafer by assigning each type of integrated circuit to a specific group. The media access control protocol can also be used in the unicast mode to enable the tester to communicate individually with one integrated circuit, for example, to conduct single integrated circuit testing. The media access control protocol can also be used to transmit test result information from the integrated circuits to the tester in a serial manner in order to prevent collisions.

In the embodiment of FIG. 2, the test control block 214 of the wireless testing structure 200 includes an application layer 216 and a comparator 218. The application layer includes a decoder 220 to analyze incoming packets and to retrieve the test information from the incoming packets according to the analysis and an encoder 222 to encode the test result information into outgoing packets. In an embodiment, the application layer decodes incoming packets carrying the test information including control signals and test data. The application layer is also configured to trigger a number of different types of tests for the integrated circuit 206 in response to the decoded incoming packets and to encode the test result information into outgoing packets.

The tests that can be triggered by the application layer 216 include, for example, built in self tests (BIST) and external tests such as an interconnections test or an internal scan test. Built in self tests can be triggered by the application layer to test various types of blocks such as analog blocks, mixed blocks, digital blocks, and MEMS blocks. To run a built in self test, the tester 102 may send only an initialization control signal to the wireless testing structure 200. In some embodiments, a built in self test module (not shown) is used to interface between the wireless testing structure and the integrated circuit and to implement a built in self test of the integrated circuit. For external tests, the tester may send test data and control signals, such as Test data In (TDI) and Test Mode Select (TMS) signals, to the integrated circuit. In some embodiments, an external test module (not shown) such as a JTAG boundary scan module as defined in IEEE 1149.1, is used to interface between the wireless test interface and the integrated circuit and to implement external tests to the integrated circuit. The wireless test interface 210 extracts the test data and control signals from the communication buffer 204 and ensures their synchronization when providing the test data and control signals to corresponding ports of the external test module and/or the integrated circuit 206.

In an embodiment, the wireless test interface 210 of the wireless testing structure 200 sends a complete set of test result information to the tester 102 in the payload of an uplink packet (from the integrated circuit to the tester). However, collecting complete test result information from each integrated circuit can be time consuming. In an alternative embodiment, the comparator 218 of the wireless test interface is used to perform a comparison of the test result information with some reference information and then the comparison information is transmitted to the tester instead of the complete set of test result information. For example, the comparator may be configured to compare test result information with a comparison vector and to produce a 1-bit comparison result that is sent to the tester in the header of a small uplink packet without an additional payload. Transmitting the 1-bit comparison information as the test result information instead of the complete test result information saves wireless bandwidth and test time. In one embodiment, the tester sends a comparison vector to the integrated circuit along with the test data and control signals. In another embodiment, the comparator may be configured to compare the test result information generated by the integrated circuit with a comparison vector according to a masking vector in the presence of unknown logic values in the integrated circuit, which may be the result of un-initialized and uncontrollable flip-flops, bus contention, floating bus, and multi-clock domains. In order to guarantee the detection of a defective integrated circuit even in the presence of unknown logic values, the masking vector, which indicates the specific bit(s) of the test result information to be compared with the corresponding bit(s) of the comparison vector, is sent along with the comparison vector from the tester to the integrated circuit.

Figure 3:
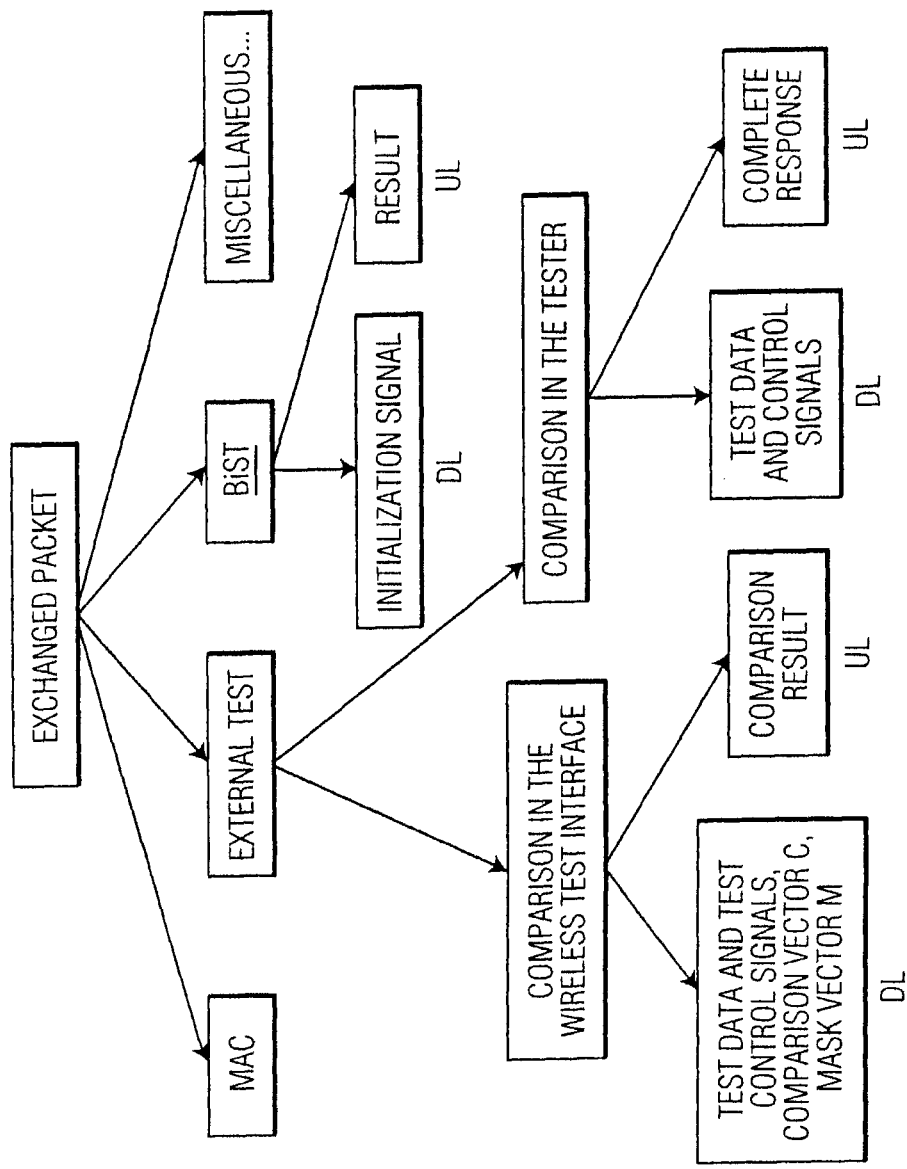
FIG. 3 illustrates a hierarchy of different types of information that can be included in packets that are wirelessly exchanged between a tester and an integrated circuit.

FIG. 3 illustrates a hierarchy of different types of information that can be included in packets that are wirelessly exchanged between a tester and an integrated circuit. The packets can be uplink (UL) packets (from the integrated circuit to the tester) or downlink (DL) packets (from the tester to the integrated circuit). In an embodiment, the uplink packets can carry media access control (MAC) configuration or acknowledgement information, BIST test result information, external test result information such as JTAG test result information, and miscellaneous information. The downlink packets can carry media access control (MAC) configuration or acknowledgement information, a BIST initialization signal, external test data and control signals, and miscellaneous information. In one embodiment, external test result packets may carry different types of information depending on whether the comparison of the test result information takes place in the wireless test interface or in the tester. If the comparison of the test result information takes place in the wireless test interface, external test packets may include downlink packets including test data, control signals such as TMS, TDI, a comparison vector, and a masking vector, and uplink packets including a comparison result in the headers. If the comparison of the test result information takes place in the tester, external test packets may include downlink packets including the test data, control signals such as TMS, TDI and uplink packets including the test result information. Miscellaneous information may include special test data for testing a circuit that is not boundary scan compliant, or data for reprogramming some internal blocks.

Whether or not downlink packets are sent from a tester to an integrated circuit may depend on the current test step. For example, a control signal such as TMS may be constant during an operation of test pattern shift-in through TDI. Once the test pattern is completely shifted, the TMS signal varies and allows the JTAG TAP controller to pass from the shift state to another state. To reduce the communication cost, the constant TMS control signal may be generated locally by the wireless test interface 210 coupled to the integrated circuit instead of being generated in the tester and transmitted in the payload of the downlink packet.

In an example of a test operation from the perspective of the wireless testing structure 200, the wireless transceiver 202 receives test information from the tester 102 and transmits test result information to the tester. The media access controller 212 implements a media access control protocol for wireless communication. The test control block 214 decodes test information received from the tester, triggers tests of the integrated circuit 206 in response to the decoded test information, and encodes test result information that is generated by the integrated circuit in response to the test.

Figure 4:
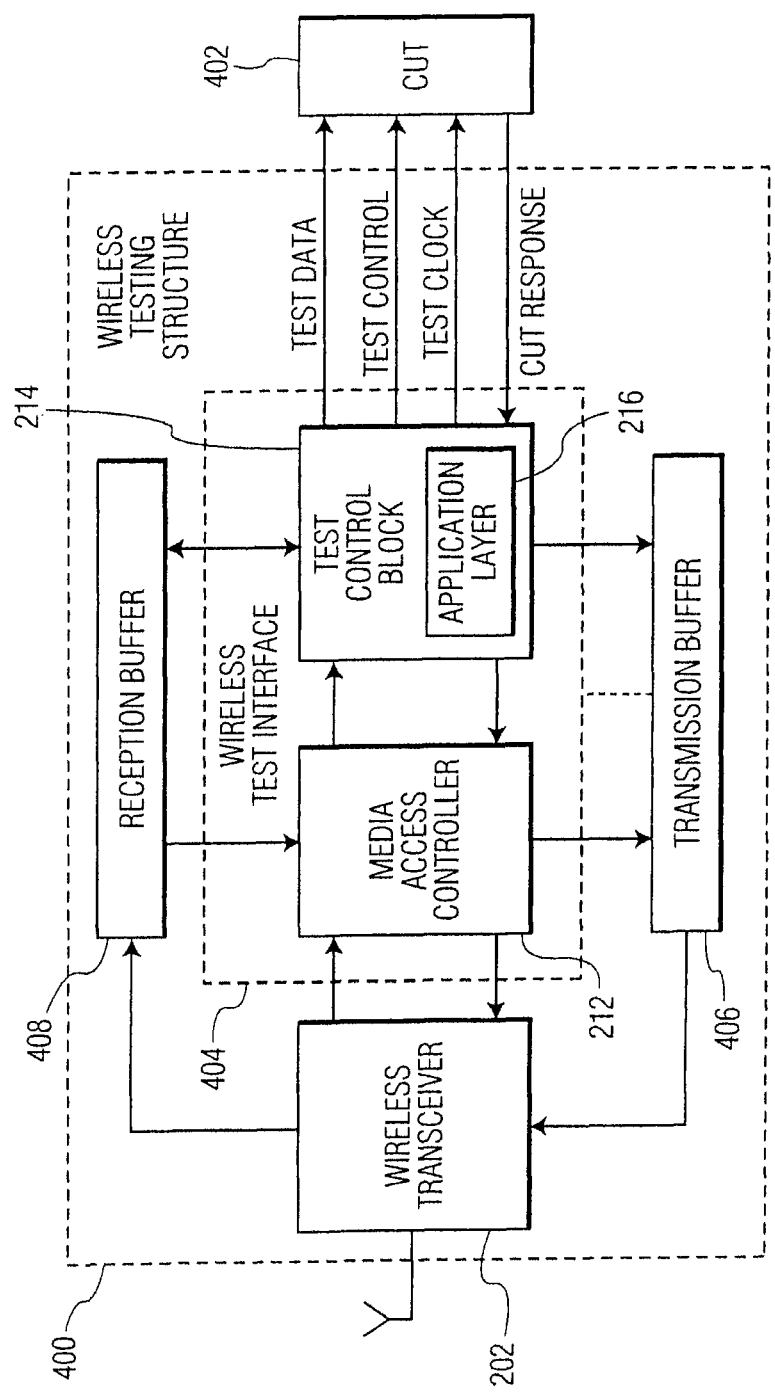
FIG. 4 depicts an embodiment of a wireless testing structure for a circuit under test (CUT).

FIG. 4 depicts an embodiment of a wireless testing structure 400 for a circuit under test (CUT) 402. In the embodiment of FIG. 4, the wireless testing structure 400 includes a wireless test interface 404, a wireless transceiver 202, a transmission buffer 406 and a reception buffer 408, and can be used for integrated circuits production testing and for integrated circuits in-situ testing. The CUT may include at least one IP block or at least one integrated circuit die such as a packaged die or a bare die. In some embodiments, the wireless testing structure may be a separated block from the CUT. In other embodiments, the wireless testing structure may be fully or partially integrated into the CUT. Although the depicted system includes several functional blocks described herein, other embodiments may include fewer or more functional blocks to implement more or less functionality.

The wireless test interface 404 includes a media access controller 212 that implements a media access control protocol for wireless communication and a test control block 214 that decodes test information received from a tester, triggers tests of the CUT 402 in response to the decoded test information, and encodes test result information that is generated by the CUT in response to the test. The test control block includes an application layer 216, which decodes incoming packets carrying the test information, triggers tests for the CUT in response to the decoded incoming packets, and encodes the test result information into outgoing packets. The tests that can be triggered by the application layer include, for example, built in self tests and external tests such as an interconnections test or an internal scan test. The transmission buffer 406 and the reception buffer 408 may be integrated into one communication buffer 204 or separated as two independent buffers. The transmission buffer and the reception buffer may be implemented in hardware, for example, random access memory (RAM), or software, or a combination of hardware and software.

Figure 5:
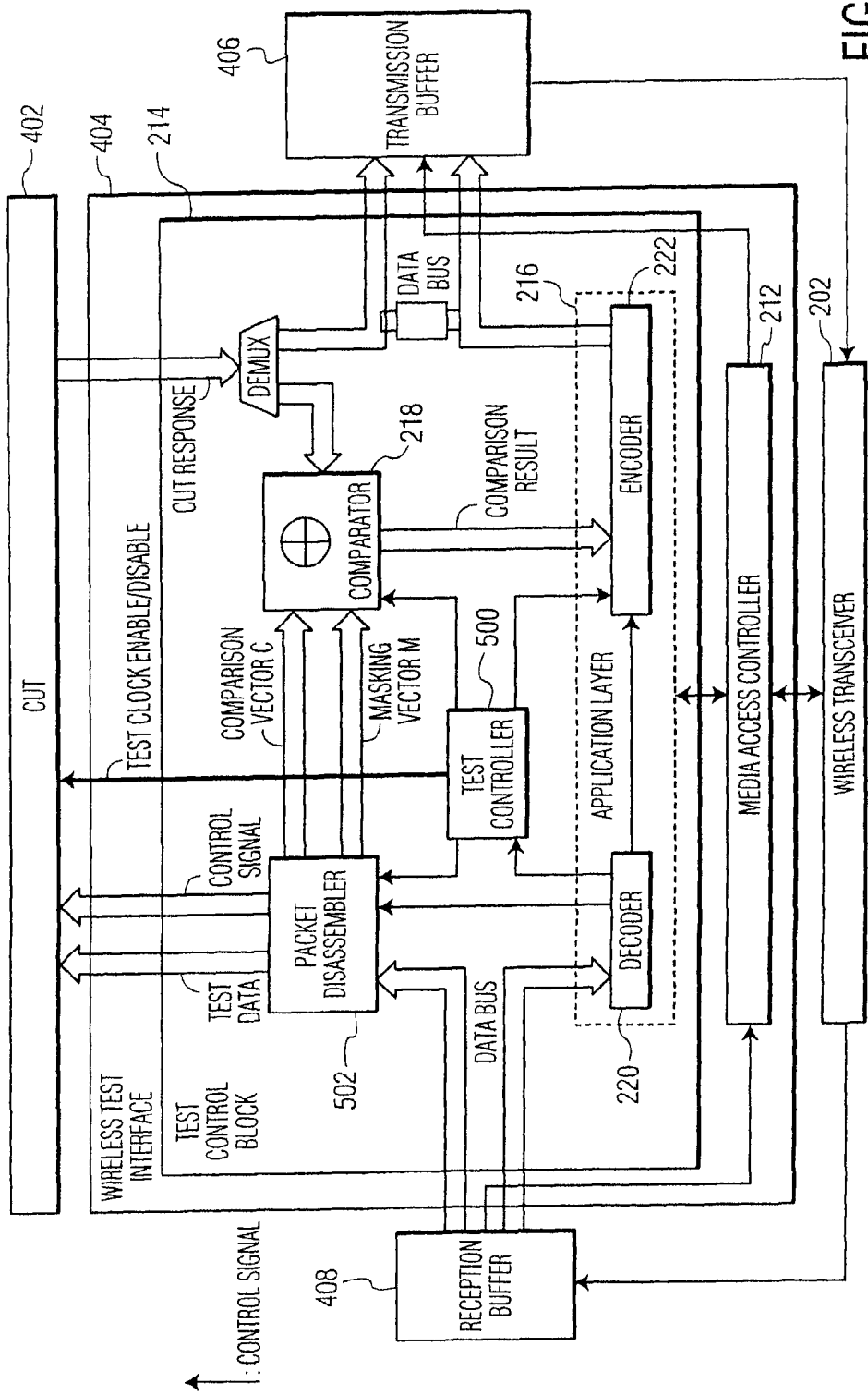
FIG. 5 is a block diagram of an embodiment of the wireless test interface of FIG. 4.

FIG. 5 is a block diagram of an embodiment of the wireless test interface 404 of the wireless testing structure 400 of FIG. 4. The wireless test interface 404 includes the media access controller 212 and the test control block 214, which includes the application layer 216, a test controller 500, a packet disassembler 502 and a comparator 218. The application layer includes a decoder 220 and an encoder 222.

In an example of a test operation from the perspective of the wireless testing interface 404, the wireless transceiver 202 receives incoming packets from the tester 102 under the coordination of the media access controller 212. The decoder 220 connects to the test controller 500 and the packet disassembler 502, analyzes the application headers of the incoming packets, and retrieves the test information. The test controller receives the retrieved test information from the decoder, and generates control signals to control the packet disassembler, to enable or disable the comparator, to enable the test clock, and to trigger the test. The packet disassembler retrieves the test signals from the received packets and ensures the synchronization of the retrieved test signals when they are applied to the corresponding blocks. The wireless interface receives a response from the CUT 402 that includes the test result information, compares the test result information at the comparator 218 with a comparison vector (C) according to a masking vector (M) or bypasses the comparator and relays the test result information to the transmission buffer 406. The encoder 222 encodes the comparison result. In some embodiments, the encoder may add an application header to the complete test result information. The wireless transceiver transmits outgoing packets to the tester under the coordination of the media access controller.

Figure 6:
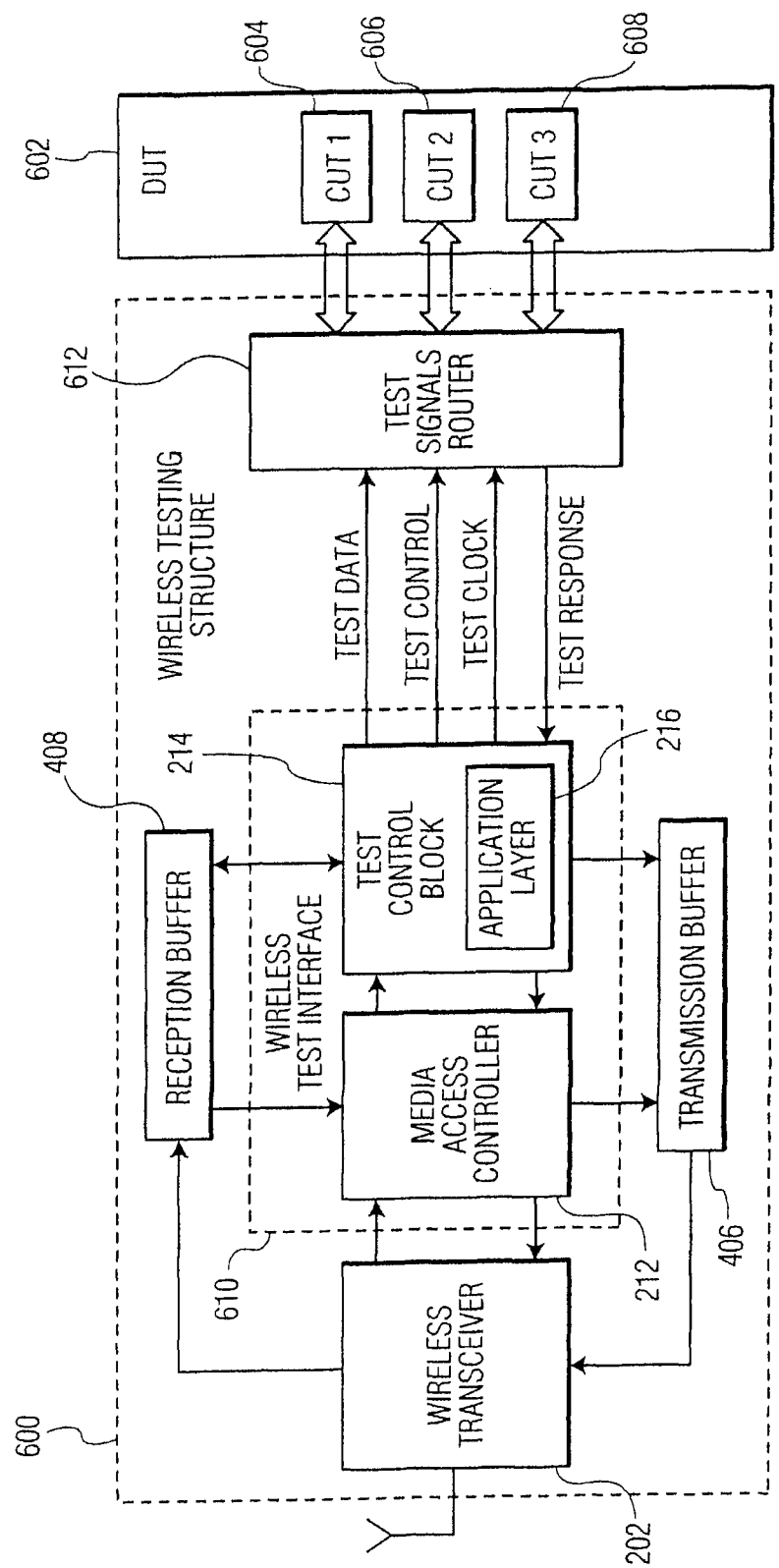
FIG. 6 depicts an embodiment of a wireless testing structure for a device under test (DUT).

FIG. 6 depicts an embodiment of a wireless testing structure 600 for a device under test (DUT) 602. In the embodiment of FIG. 6, the wireless testing structure 600 includes a wireless test interface 610, a wireless transceiver 202, a transmission buffer 406, a reception buffer 408, and a test signal router 612, and can be used for integrated circuits production testing and for integrated circuits in-situ testing. The DUT may include multiple CUTs and may be a System on Chip (SoC), a System in Package (SiP) or a Printed circuit board (PCB). In the embodiment of FIG. 6, the DUT includes 3 CUTs, CUT 1 604, CUT 2 606, and CUT 3 608. In some embodiments, the wireless testing structure may be a separate block from the DUT. In some embodiments, the wireless testing structure may be an integrated block into the DUT separate from all the CUTs. In some embodiments, the wireless testing structure may be an integrated block of one CUT. Although the depicted system includes several functional blocks described herein, other embodiments may include fewer or more functional blocks to implement more or less functionality.

The wireless test interface 610 includes a media access controller 212 that implements a media access control protocol for wireless communication and a test control block 214 that includes an application layer 216 that decodes test information received from a tester, triggers a test of the DUT in response to the decoded test information, and encodes test result information that is generated by the DUT 602 in response to the test. The tests that can be triggered by the application layer include, for example, built in self tests and external tests such as an interconnections test or an internal scan test. The transmission buffer and the reception buffer may be integrated into one communication buffer 204 or separated as two independent buffers. The transmission buffer 406 and the reception buffer 408 may be implemented in hardware, for example, random access memory (RAM), or software, or a combination of hardware and software. The test signal router 612 routes the test signals, including, for example, a test clock signal, a test control signal, and a test data signal to the corresponding CUT and routes the test response from CUT 1 604, CUT 2 606, and CUT 3 608 to the wireless test interface.

Figure 7:
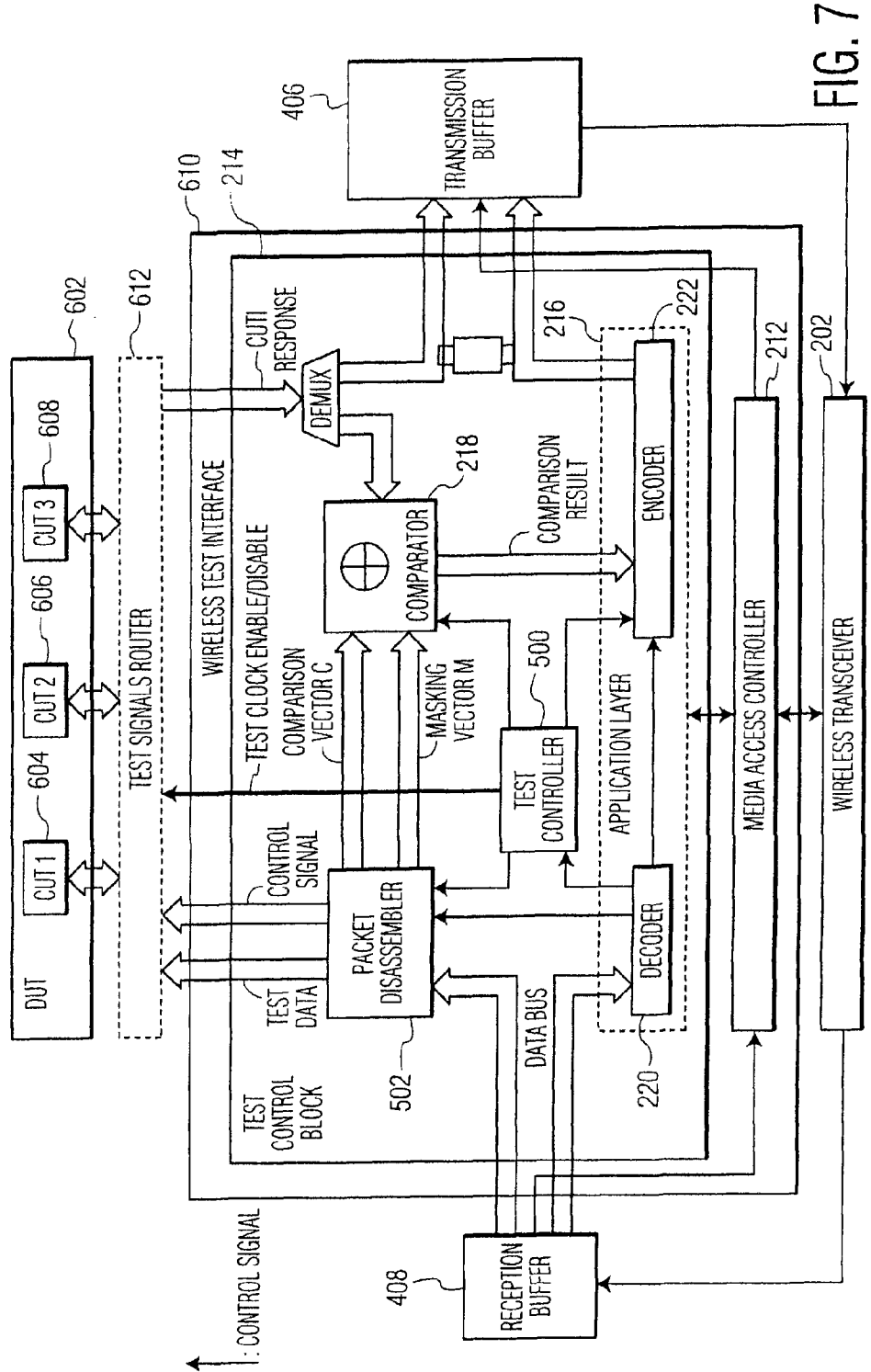
FIG. 7 is a block diagram of an embodiment of the wireless test interface of FIG. 6.

FIG. 7 is a block diagram of an embodiment of the wireless test interface of FIG. 6. The wireless test interface 610 includes the media access controller 212, the application layer 216, the test signal router 612, and the test control block 214, which includes the application layer 216, a test controller 500, a packet disassembler 502 and a comparator 218. In some embodiments, the test signal router is part of the wireless test interface. In some other embodiments, the test signal router is part of the wireless testing structure 600, but not part of the wireless test interface. The application layer includes a decoder 220 and an encoder 222.

In an example of a test operation from the perspective of the wireless testing interface 610, the wireless transceiver 202 receives incoming packets from the tester 102 under the coordination of the media access controller 212. The decoder 220 connects to the test controller 500 and the packet disassembler 502, analyzes the application headers of the incoming packets, and retrieves the test information. The test controller receives the retrieved test information from the decoder, and generates control signals to control the packet disassembler, to enable or disable the comparator, to enable the test clock, and to trigger the test of a corresponding CUT. The packet disassembler retrieves the test signals from the received packets and ensures the synchronization of the retrieved test signals when they are applied to the corresponding blocks. The test signal router 612 routes the test signals, including, for example, a test clock signal, a test control signal, and a test data signal the corresponding CUTs and routes the test response from CUT 1 604, CUT 2 606, and CUT 3 608 to the wireless test interface. The wireless interface receives a response from a CUT that includes the test result information of the CUT, compares the test result information at the comparator 218 with a comparison vector (C) according to a masking vector (M), or bypasses the comparator and relays the test result information to the transmission buffer 406. The encoder 222 encodes the comparison result. In some embodiments, the encoder may add an application header to the complete test result information. The wireless transceiver transmits outgoing packets to the tester under the coordination of the media access controller.

Figure 8:
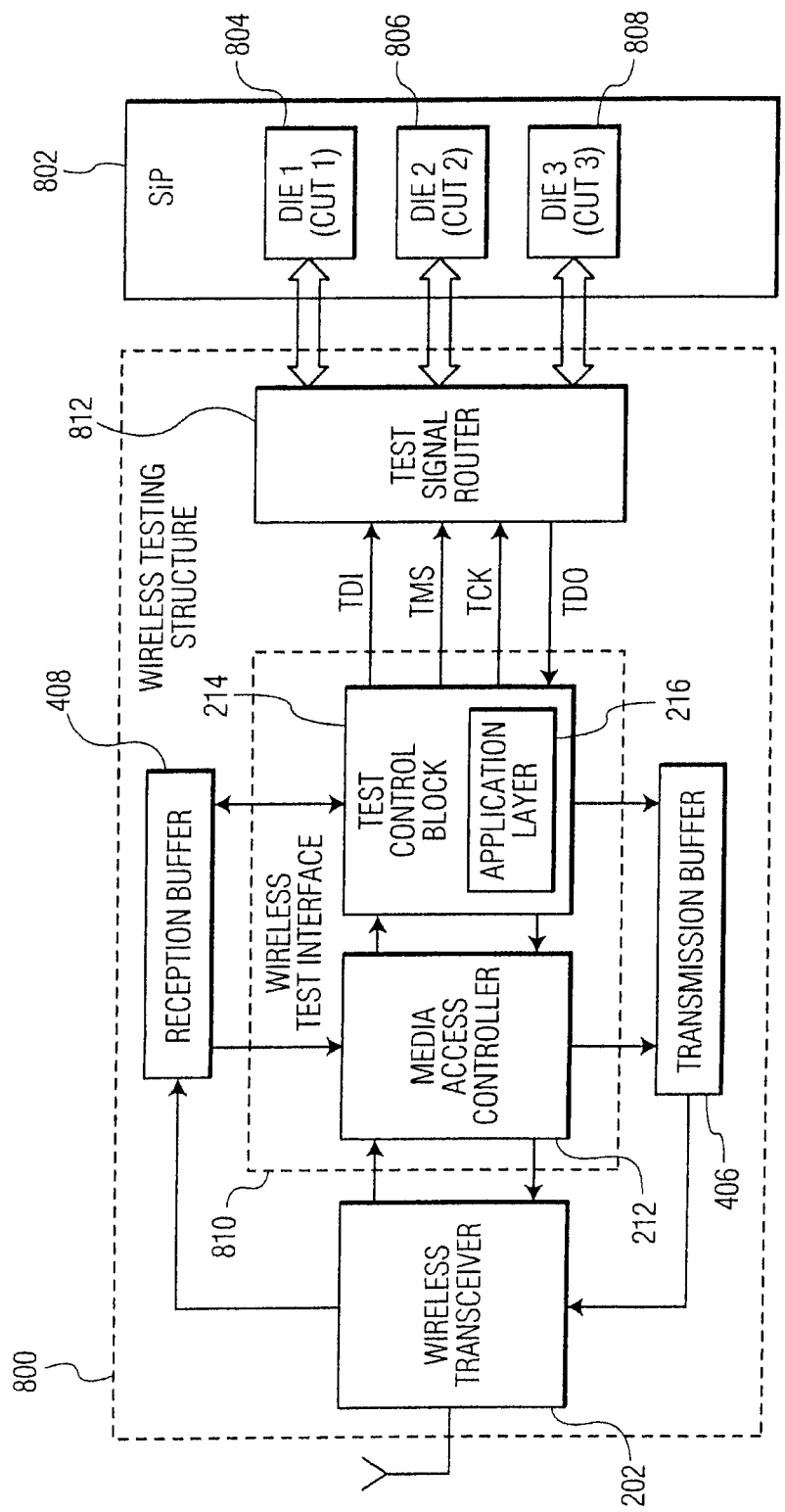
FIG. 8 depicts an embodiment of a wireless testing structure for a System in Package (SiP).

FIG. 8 depicts an embodiment of a wireless testing structure 800 for a System in Package (SiP) 802. In the embodiment of FIG. 8, the wireless testing structure 800 includes a wireless test interface 810, a wireless transceiver 202, a transmission buffer 406, a reception buffer 408, and a test signal router 812, and can be used for integrated circuit production testing and for integrated circuit in-situ testing. The SiP is a DUT that includes multiple integrated circuit dies, where some or all of the integrated circuit dies have Joint Test Action Group (JTAG) controllers and are JTAG boundary scan compliant. In an embodiment, during the SiP fabrication process, once an integrated circuit die is assembled, the SiP wirelessly undergoes a test to verify whether the assembling step has generated any defects and to detect the defected SiP, Once the defected SiP is detected, the SiP assembling process is stopped. Stopping the SiP assembling process at this point saves the resources that would otherwise be spent on an already defective SiP. In the embodiment of FIG. 8, the SiP includes 3 integrated circuit dies, Die 1 804, Die 2 806, and Die 3 808. In some embodiments, the wireless testing structure may be a separate block from the SiP. In some embodiments, the wireless testing structure may be an integrated block in the SiP that is separate from all the integrated circuit dies. In some embodiments, the wireless testing structure may be an integrated block of one integrated circuit die. Although the depicted system includes several functional blocks described herein, other embodiments may include fewer or more functional blocks to implement more or less functionality.

The wireless test interface 810 of FIG. 8 includes a media access controller 212 that implements a media access control protocol for wireless communication and a test control block 214 that includes an application layer 216. The application layer decodes test information received from a tester, triggers a test of the SiP in response to the decoded test information, and encodes test result information that is generated by the SiP in response to the test. The tests that can be triggered by the application layer include, for example, built in self tests and external tests such as an interconnections test or an internal scan test. The test signal router 812, which can be a SiP Test Access Port (TAP), routes the JTAG test input signals, including Test Clock (TCK), Test Data In (TDI), and Test Mode Select (TMS) signals, to the corresponding integrated circuit die of the SiP 802 and routes the test result information from the Test Data Out (TDO) signals of the integrated circuit dies, Die 1 804, Die 2 806, and Die 3 808, to the wireless test interface. The transmission buffer and the reception buffer may be integrated into one communication buffer 204 or separated as two independent buffers. The transmission buffer 406 and the reception buffer 408 may be implemented in hardware, for example, random access memory (RAM), or software, or a combination of hardware and software. Although the depicted system includes several functional blocks described herein, other embodiments may include fewer or more functional blocks to implement more or less functionality.

Figure 9:
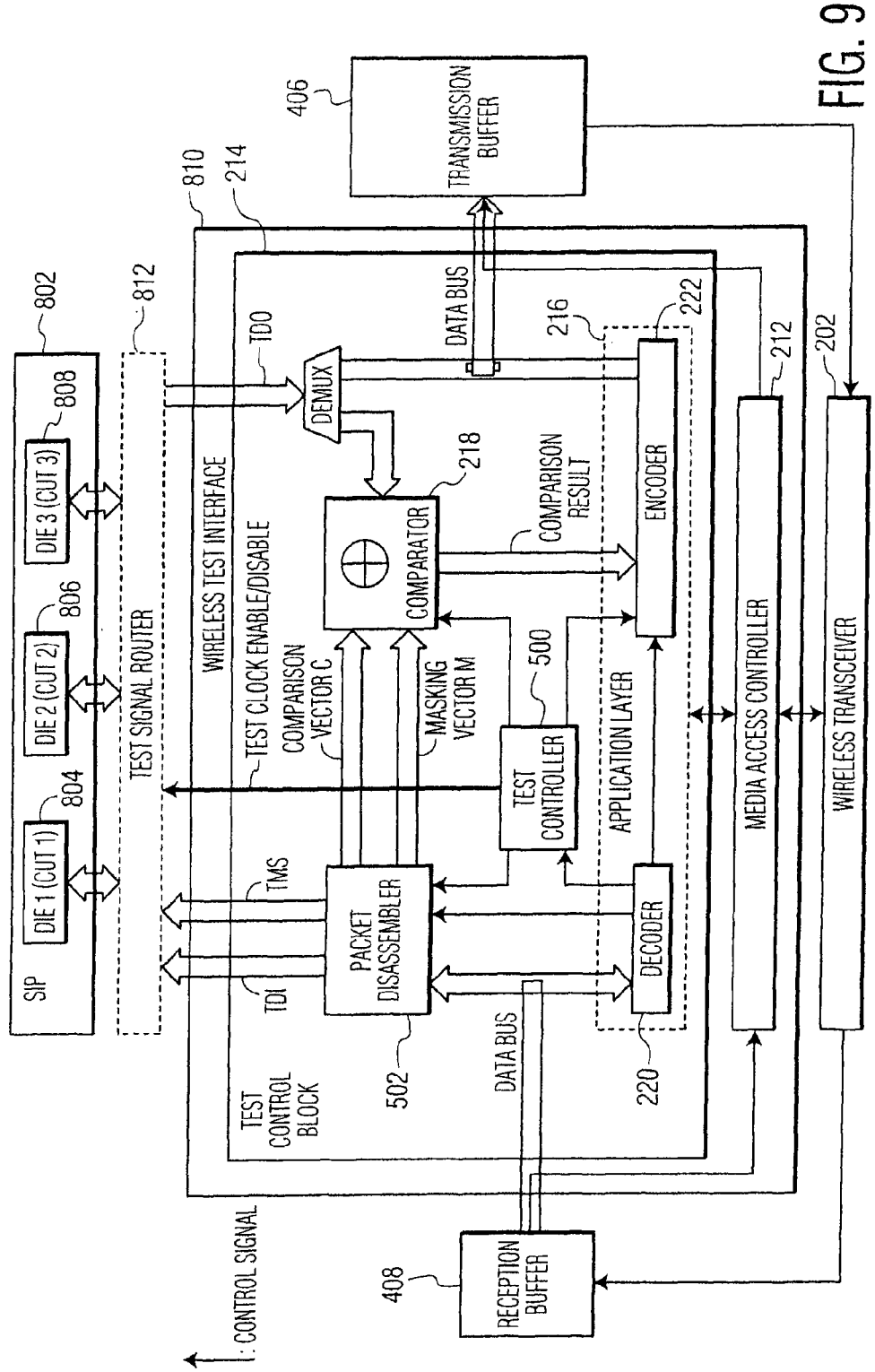
FIG. 9 is a block diagram of an embodiment of the wireless test interface of FIG. 8.

FIG. 9 is a block diagram of an embodiment of the wireless test interface of FIG. 8. The wireless test interface 810 includes the media access controller 212, the test signal router 812, and the test control block 214, which includes the application layer 216, a test controller 500, a packet disassembler 502 and a comparator 218. In some embodiments, the test signal router is part of the wireless test interface. In some embodiments, the test signal router is part of the wireless testing structure 800, but not part of the wireless test interface. The application layer includes a decoder 220 and an encoder 222.

In an example of a test operation from the perspective of the wireless testing interface 810, the wireless transceiver 202 receives incoming packets from the tester 102 under the coordination of the media access controller 212. The decoder 220 connects to the test controller 500 and the packet disassembler 502, analyzes the application headers of the incoming packets, and retrieves the test information. The test controller receives the retrieved test information from the decoder, and generates control signals to control the packet disassembler, to enable or disable the comparator, to enable the test clock, and to trigger the test of a corresponding die. The packet disassembler retrieves the test signals from the received packets and ensures the synchronization of the retrieved test signals when they are applied to the corresponding blocks. The test signal router 812, which may be a SiP TAP, routes the JTAG test input signals, including TCK, TDI, and TMS signals, to the corresponding integrated circuit die of the SiP 802 and routes the test result information from the TDO signals of the integrated circuit dies to the wireless test interface. The wireless interface receives a response from a die that includes the test result information of the die, compares the test result information at the comparator 218 with a comparison vector (C) according to a masking vector (M), or bypasses the comparator and relays the test result information to the transmission buffer 406. The encoder 222 encodes the comparison result. In some embodiments, the encoder may add an application header to the complete test result information. The wireless transceiver transmits outgoing packets to the tester under the coordination of the media access controller.

Figure 10:
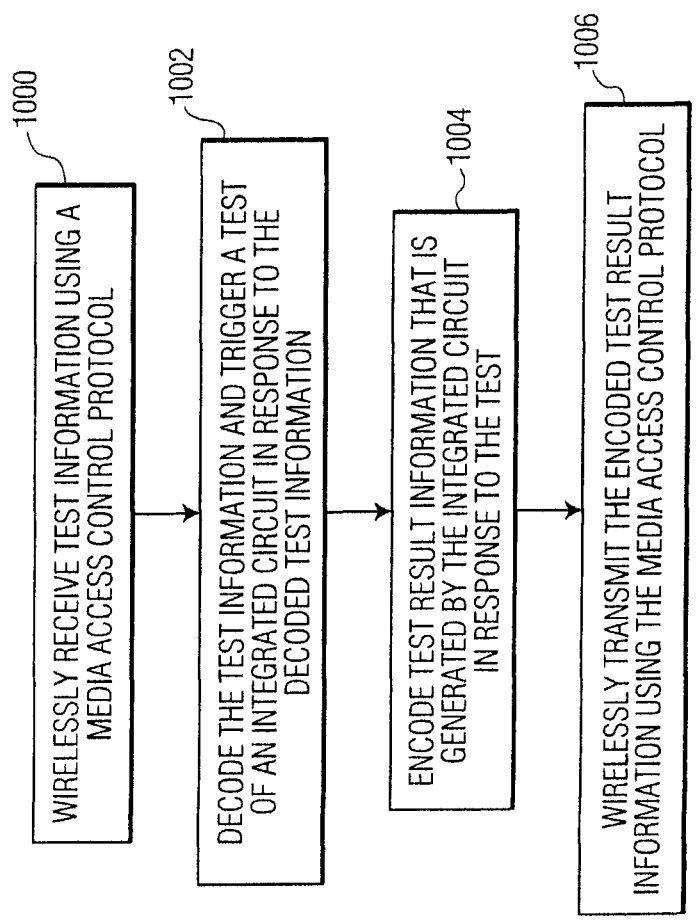
FIG. 10 is a process flow diagram of a method for wirelessly testing an integrated circuit in accordance with an embodiment of the invention.

FIG. 10 is a process flow diagram of a method for wirelessly testing an integrated circuit in accordance with an embodiment of the invention. At block 1000, test information is wirelessly received using a media access control protocol. At block 1002, the test information is decoded and a test of an integrated circuit 206 is triggered in response to the decoded test information. At block 1004, test result information that is generated by the integrated circuit in response to the test is encoded. At block 1006, the encoded test result information is wirelessly transmitted using the media access control protocol.

In an alternative embodiment, the above described techniques can be applied to implement parallel wireless testing of multiple integrated circuits. Sending test information, which may include test data and control signals, serially to each integrated circuit is a time consuming operation. In an embodiment, the media access control protocol within the tester 102 and the wireless testing structure 800 enables broadcasting of test information to multiple integrated circuits in the downlink direction, Broadcasting test information to multiple integrated circuits enables much more time efficient testing of multiple integrated circuits. The media access control protocol implemented by the wireless test interfaces of the integrated circuits also enables the serial transmission of test result information from multiple integrated circuits to the tester. For example, each integrated circuit may individually use the unicast mode of the media access control protocol to send test result information back to the tester in a serial manner.

Figure 11:
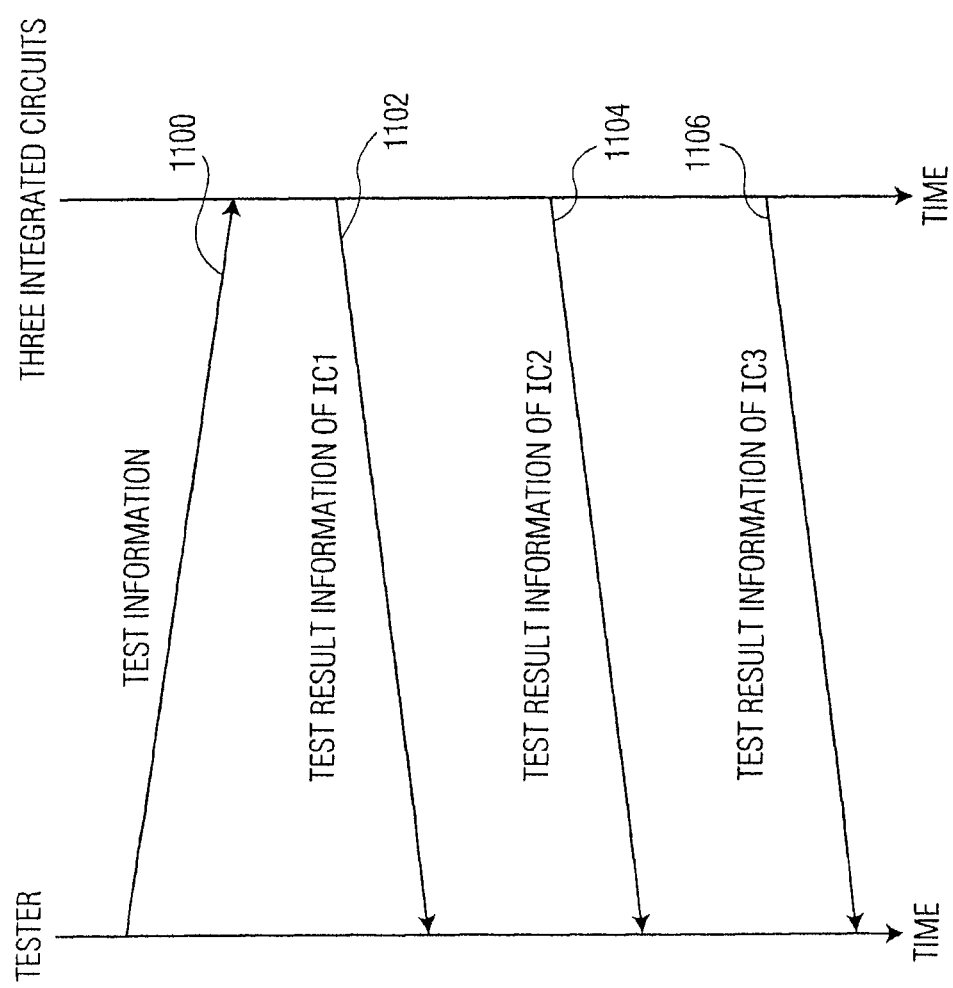
FIG. 11 illustrates a time-line of a communication sequence for wirelessly implementing tests on three integrated circuits in accordance with an embodiment of the invention.

Examples of techniques for wirelessly implementing tests on multiple integrated circuits are described with reference to FIG. 11 and FIG. 12. FIG. 11 illustrates a time-line of a communication sequence for wirelessly implementing tests on three integrated circuits in accordance with an embodiment of the invention. At step 1100, a tester 102 broadcasts the same set of test information to three integrated circuits, IC1, IC2, and IC3 using the broadcast mode of the media access control protocol. At steps 1102, 1104, 1106, the integrated circuits then run the corresponding test and individually send their test result information back to the tester in a serial manner in order to avoid collisions. In one embodiment, each integrated circuit uses the unicast mode of the media access control protocol to send test result information back to the tester.

Figure 12:
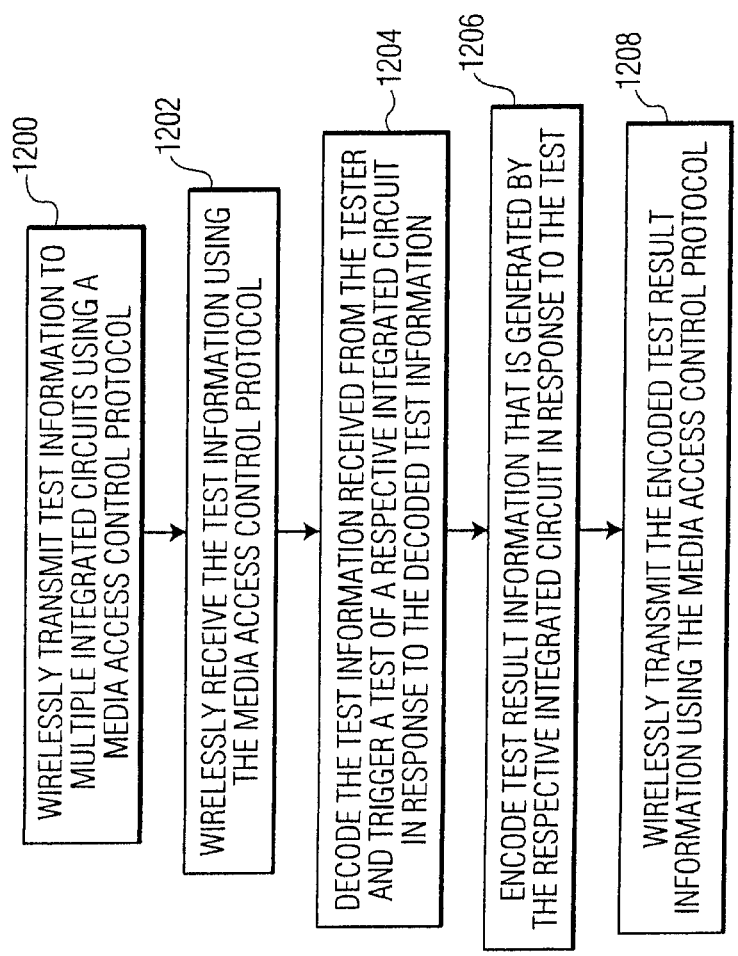
FIG. 12 is a process flow diagram of a method for wirelessly implementing tests on multiple integrated circuits in accordance with an embodiment of the invention.

FIG. 12 is a process flow diagram of a method for wirelessly implementing tests on multiple integrated circuit in accordance with an embodiment of the invention. At block 1200, test information is wirelessly transmitted to multiple integrated circuits using a media access control protocol. At block 1202, the test information is wirelessly received using the media access control protocol. At block 1204, the test information is decoded and a test of a respective integrated circuit is triggered in response to the decoded test information. At block 1206, test result information that is generated by the respective integrated circuit in response to the test is encoded. At block 1208, the encoded test result information is wirelessly transmitted using the media access control protocol.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Embodiments of the system and method for wirelessly testing integrated circuits can be applied to simultaneously testing a number of integrated circuit dies shortly after fabrication and while the dies are still in wafer form or, testing integrated circuits after the have been packaged and put into use for their intended purpose. Embodiments of the system and method for wirelessly testing integrated circuits can also be applied non-testing applications, such as programming or configuring some internal blocks in the integrated circuits.

Although specific embodiments of the invention have been described and illustrated, the invention is not to be limited to the specific forms or arrangements of parts so described and illustrated. The scope of the invention is to be defined by the claims appended hereto and their equivalents.

The invention claimed is:

1. A wireless testing structure for an integrated circuit, comprising:
   a wireless transceiver configured to receive test information from a tester and transmit test result information to the tester; and
   a wireless test interface configured to interface between the wireless transceiver and the integrated circuit, the wireless test interface comprising:
   a media access controller configured to implement a media access control protocol for wireless communication; and
   a test control block configured to decode test information received from the tester, to trigger a number of different types of tests of the integrated circuit in response to the decoded test information, and to encode test result information that is generated by the integrated circuit in response to the test; and
   a test control block including a comparator configured to compare the test result information generated by the integrated circuit with a comparison vector and to produce a comparison result as the test result information.

2. The wireless testing structure of claim 1, wherein the test control block includes an application layer configured to decode an incoming packet carrying the test information including control signals and test data, to trigger a number of different types of tests for the integrated circuit in response to the decoded incoming packet, and to encode the test result information into an outgoing packet; the tests that can be triggered by the application layer including, built in self tests (BIST) and external tests.

3. The wireless testing structure of claim 2, wherein the application layer includes a decoder configured to analyze the incoming packet and to retrieve the test information from the incoming packet according to the analysis, and an encoder configured to encode the test result information into the outgoing packet; test result packets being able to carry different types of information depending on whether the comparison of the test result information takes place in the wireless test interface or in the tester.

4. The wireless testing structure of claim 1, wherein the comparator is further configured to compare the test result information generated by the integrated circuit with the comparison vector according to a masking vector which indicates the specific bit(s) of the test result information to be compared with the corresponding bit(s) of the comparison vector, in order to guarantee the detection of a defective integrated circuit even in the presence of unknown logic values.

5. The wireless testing structure of claim 1, further comprising a test signal router configured to route the test information to a corresponding circuit block of the integrated circuit and route the test result information generated by the corresponding circuit block of the integrated circuit in response to the test to the wireless testing structure.

6. The wireless testing structure of claim 5, wherein the test signal router is a SiP Test Access Port.

7. The wireless testing structure of claim 1, wherein the wireless testing structure is separated from the integrated circuit, while allowing simultaneously testing of a number of integrated circuits, while allowing simultaneously testing of a number of integrated circuits.

8. The wireless testing structure of claim 1, wherein the wireless testing structure is at least partially integrated in the integrated circuit, allowing thus simultaneously testing of a number of integrated circuits after fabrication and while the integrated circuits are still in wafer form or, testing integrated circuits after the integrated circuits have been packaged and put into use for their intended purpose.

9. The wireless testing structure of claim 1, wherein the media access control protocol is configured to support broadcast, multicast, and unicast modes; the media access control protocol being used in the multicast mode to establish groups that allow the tester to exclude faulty integrated circuits by assigning them to at least one group according to their fault type, or to test a heterogeneous wafer by assigning each type of integrated circuit to a specific group; the media access control protocol being used in the unicast mode to enable the tester to communicate individually with one integrated circuit to conduct single integrated circuit testing.

10. A method for wirelessly testing an integrated circuit comprising:
    wirelessly transmitting test information to at least one integrated circuit using a media access control protocol;
    wirelessly receiving test information using the media access control protocol;
    decoding the test information and triggering a number of different types of test of the integrated circuit in response to the decoded test information;
    encoding test result information that is generated by the integrated circuit in response to the test;
    comparing the test result information generated by the integrated circuit with a comparison vector and producing a comparison result as the test result information; and
    wirelessly transmitting the encoded test result information using the media access control protocol.

11. The method of claim 10, wherein decoding the test information includes analyzing an incoming packet carrying the test information and retrieving the test information from the incoming packet according to the analysis, and wherein encoding test result information that is generated by the integrated circuit in response to the test includes encoding the test result information into an outgoing packet; test result packets being able to carry different types of information depending on whether the comparison of the test result information takes place in the wireless test interface or in the tester.

12. The method of claim 11, further comprising comparing the test result information generated by the integrated circuit with the comparison vector according to a masking vector.

13. The method of claim 10, wherein the media access control protocol supports broadcast, multicast, and unicast modes; the media access control protocol being used in the multicast mode to establish groups that allow the tester to exclude faulty integrated circuits by assigning them to at least one group according to their fault type, or to test a heterogeneous wafer by assigning each type of integrated circuit to a specific group; the media access control protocol being used in the unicast mode to enable the tester to communicate individually with one integrated circuit to conduct single integrated circuit testing.

14. A wireless testing structure for an integrated circuit, comprising:
- a wireless transceiver configured to receive test information from a tester and transmit test result information to the tester; and
- a wireless test interface configured to interface between the wireless transceiver and the integrated circuit, the wireless test interface comprising:
- a media access controller configured to implement a media access control protocol for wireless communication, wherein the media access control protocol is configured to support broadcast, multicast, and unicast modes; the media access control protocol being used in the multicast mode to establish groups that allow the tester to exclude faulty integrated circuits by assigning them to at least one group according to their fault type, or to test a heterogeneous wafer by assigning each type of integrated circuit to a specific group, the media access control protocol being used in the unicast mode to enable the tester to communicate individually with one integrated circuit to conduct single integrated circuit testing; and
- a test control block configured to decode test information received from the tester, to trigger a number of different types of tests of the integrated circuit in response to the decoded test information, and to encode test result information that is generated by the integrated circuit in response to the test; and
- a test control block including a comparator configured to compare the test result information generated by the integrated circuit with a comparison vector and to produce a comparison result as the test result information.

15. The wireless testing structure of claim 14, wherein the test control block includes an application layer configured to decode an incoming packet carrying the test information including control signals and test data, to trigger a number of different types of tests for the integrated circuit in response to the decoded incoming packet, and to encode the test result information into an outgoing packet; the tests that can be triggered by the application layer including, built in self tests (BIST) and external tests.

16. The wireless testing structure of claim 15, wherein the application layer includes a decoder configured to analyze the incoming packet and to retrieve the test information from the incoming packet according to the analysis, and an encoder configured to encode the test result information into the outgoing packet; test result packets being able to carry different types of information depending on whether the comparison of the test result information takes place in the wireless test interface or in the tester.

17. The wireless testing structure of claim 14, wherein the comparator is further configured to compare the test result information generated by the integrated circuit with the comparison vector according to a masking vector which indicates the specific bit(s) of the test result information to be compared with the corresponding bit(s) of the comparison vector, in order to guarantee the detection of a defective integrated circuit even in the presence of unknown logic values.

18. The wireless testing structure of claim 14, further comprising a test signal router configured to route the test information to a corresponding circuit block of the integrated circuit and route the test result information generated by the corresponding circuit block of the integrated circuit in response to the test to the wireless testing structure.

19. The wireless testing structure of claim 18, wherein the test signal router is a SiP Test Access Port.

20. The wireless testing structure of claim 14, wherein the wireless testing structure is separated from the integrated circuit, while allowing simultaneously testing of a number of integrated circuits, while allowing simultaneously testing of a number of integrated circuits.

21. The wireless testing structure of claim 14, wherein the wireless testing structure is at least partially integrated in the integrated circuit, allowing thus simultaneously testing of a number of integrated circuits after fabrication and while the integrated circuits are still in wafer form or, testing integrated circuits after the integrated circuits have been packaged and put into use for their intended purpose.

22. A method for wirelessly testing an integrated circuit comprising:
- wirelessly transmitting test information to at least one integrated circuit using a media access control protocol, wherein the media access control protocol supports broadcast, multicast, and unicast modes; the media access control protocol being used in the multicast mode to establish groups that allow the tester to exclude faulty integrated circuits by assigning them to at least one group according to their fault type, or to test a heterogeneous wafer by assigning each type of integrated circuit to a specific group; the media access control protocol being used in the unicast mode to enable the tester to communicate individually with one integrated circuit to conduct single integrated circuit testing;
- wirelessly receiving test information using the media access control protocol;
- decoding the test information and triggering a number of different types of test of the integrated circuit in response to the decoded test information;
- encoding test result information that is generated by the integrated circuit in response to the test;
- comparing the test result information generated by the integrated circuit with a comparison vector and producing a comparison result as the test result information; and
- wirelessly transmitting the encoded test result information using the media access control protocol.

23. The method of claim 22, wherein decoding the test information includes analyzing an incoming packet carrying the test information and retrieving the test information from the incoming packet according to the analysis, and wherein encoding test result information that is generated by the integrated circuit in response to the test includes encoding the test result information into an outgoing packet; test result packets being able to carry different types of information depending on whether the comparison of the test result information takes place in the wireless test interface or in the tester.

24. The method of claim 23, further comprising comparing the test result information generated by the integrated circuit with the comparison vector according to a masking vector.

* * * * *